US006181263B1

(12) United States Patent
Malik et al.

(10) Patent No.: US 6,181,263 B1
(45) Date of Patent: Jan. 30, 2001

(54) SIGNAL PROCESSOR

(75) Inventors: Hassan Malik, Milpitas; William C. Rempfer, Los Altos; James L. Brubaker, San Jose, all of CA (US)

(73) Assignee: Linear Technology Corp., Milpitas, CA (US)

( * ) Notice: Under 35 U.S.C. 154(b), the term of this patent shall be extended for 0 days.

(21) Appl. No.: 09/258,534

(22) Filed: Feb. 26, 1999

(51) Int. Cl.[7] ............. H03M 1/06; H03M 1/78

(52) U.S. Cl. .................... 341/118; 341/154

(58) Field of Search .................. 341/144, 145, 341/118, 120, 154

(56) References Cited

U.S. PATENT DOCUMENTS

| | | | |
|---|---|---|---|
| 4,491,825 | * | 1/1985 | Tuthill .................... 341/145 |
| 4,686,511 | * | 8/1987 | Koen ..................... 341/118 |
| 5,319,371 | | 6/1994 | Curtin et al. . |
| 5,396,245 | | 3/1995 | Rempfer . |
| 5,714,953 | * | 2/1998 | Mitani et al. ............. 341/144 |

* cited by examiner

Primary Examiner—Patrick Wamsley
(74) Attorney, Agent, or Firm—Fish & Neave; Joel Weiss

(57) ABSTRACT

A switch impedance insensitive signal processor is provided. A signal processor according to the present invention overcomes the problem of switch impedance by adding an individual buffer, e.g. a unity-gain amplifier, between the switch and the processor portion of the circuit. The buffer isolates the signal processor from the switch impedance.

16 Claims, 4 Drawing Sheets

SIGNAL PROCESSOR

BACKGROUND OF THE INVENTION

This invention relates to signal processing. More specifically, this invention relates to improving performance and reducing die space of a DAC.

Typically, high-accuracy signal processors that utilize analog switches face a common problem. Each analog switch includes a resistance, e.g., about 50 ohms, which tends to affect the accuracy of the output signal as a function of the input signal.

To better understand this problem as it occurs in DACs, a short introduction to DACs will be presented. Then, the relationship between the problem stated above and DACs will be discussed.

DACs translate binary signals from computers or other discrete circuitry into proportional analog-voltage levels. DACs are commonly used to drive analog devices such as meters, motor controllers, or audio circuitry.

The binary-weighted resistor-string DAC is the simplest method of converting digital bits from a digital signal into an analog signal. For the circuit 100 shown in FIG. 1, a binary signal is applied to gating circuits 118 that drive analog switches 102, 104, 106 and 108. When a binary signal of 0000 is applied to the switches, all the switches are open so no voltage is applied to the op-amp 122. At this point, the output is 0 volts. When a 0001 binary signal is applied, switch 102 closes and −10 volts is applied to resistor 110. Because the input of op-amp 122 represents virtual ground, there is 10 volts across the 8000 ohm resistor 110. That causes 10 V/8000 ohm, or 1.25 milliamps, to flow through the 800 ohm feedback resistor 120. By Ohm's law, the voltage across resistor 120 would be 800 ohm×1.25 milliamps, or 1 volt.

When the binary signal changes to 0010, switch 102 opens and switch 104 closes. That causes 2.5 milliamps (10 volts/4000 ohms) to flow through resistor 120. The voltage across resistor 120 is then 800 ohms×2.5 milliamps, or 2 volts. A binary 0100 would create 4 volts at the output, and so on.

A resistor-string DAC is not practical, however, for applications requiring much more than 4 bits of resolution because the range of resistor values required is very large and difficult to fabricate accurately. An R-2R ladder network has become the DAC of choice, therefore, in most applications.

The R-2R ladder network is capable of producing binary-weighted voltages with resistors having only two different values of resistance arranged in a type of network known as a binary ladder, shown in FIG. 2. In this circuit, a series of latches 240 are used to drive analog switches 202, 204, 206 and 208.

The R-2R ladder operates such that, when an individual switch is closed, each "rung" on the R-2R ladder delivers a current to the virtual ground node. Because of the arrangement of resistors 210, 212, 214, 216, 218, 220, 222 and 224, the current delivered by each successive rung is binarily weighted. Thus, each successive switch going down the ladder, when connected, produces a current, which, in turn, produces half the output voltage of the switch above it.

For example, when a binary 0000 is transmitted to latches 240, this opens all of the switches and disconnects $V_{REF}$ from the output. This causes 0 volts to appear at the output of the op-amp 230. A binary signal of 1000 will close switch 202, thus activating the MSB (most significant bit). By Ohm's law, the current flowing through resistor 210 will cause a 5 volt signal to appear at the output. A signal of 0100 open switch 202 and closes switch 204 and results in a 2.5 volt signal at the output.

The primary advantage of the binary ladder design over the resistor-string DAC is its use of resistors having only two resistor values. As a result, it is a simple matter to process virtually any number of bits simply by adding additional "rungs" to the ladder.

The problem discussed above affects the binary ladder DAC with regard to the resistances of analog switches 202, 204, 206 and 208. The switches form part of the R-2R ladder, and connect the appropriate 2R leg to either one of the reference voltages depending on the input digital code. The switch resistances influence the resistor ratio of the R-2R ladder because the switches are in series with the 2R portion of the R-2R ladder network. Effectively, the resistance of the switches is added to the 2R portion of the ladder network. This change in resistor ratio increases the differential non-linearity (the error in each individual step of analog voltage produced by successive digital inputs) and the integral non-linearity (the error over the entire range of analog values produced by the entire range of digital inputs) of the DAC.

Differential and integral non-linearities degrade performance of the DAC and may also cause non-monotonicity. Non-monotonicity occurs when the DAC output does not increase as the digital input code is increased. For example, in a stepped motor controller, non-monotonicity would result in the motor being stepped down rather than up when the digital input is increased. Non-monotonicity is an unacceptable condition for many high-accuracy applications.

One conventional method of reducing the non-linearities created by the switch resistances is to scale the sizes of the switches so there is a constant voltage drop across them. This, however, consumes area and only works to a first order. There can be several second order affects that cannot be compensated for by scaling. In addition, because the switches switch between two different voltages, any voltage dependence in their resistance value introduces mismatches. These mismatches create errors, as described above.

Therefore, it would be desirable to provide a signal processor that was not influenced by the resistance of analog switches used in the signal processor.

It would also be desirable to provide a digital-to-analog converter using an R-2R resistor ladder that was not influenced by the resistance of the switches used in the ladder.

SUMMARY OF THE INVENTION

A signal processor that includes signal processing elements and analog switches is provided. Each of the analog switches has a switch resistance that may affect the accuracy of the output signal of the signal processor. The signal processor isolates the switch resistances (or any other impedance) from the signal processing elements of the processor with individual buffers. This substantially eliminates the effect of the switches (or other impedance) on the output signal.

In an alternative embodiment of the invention, a DAC that converts a digital signal to an analog signal while being immune to switch resistance errors is also provided. The DAC may preferably include a Most Significant Bit (MSB) DAC, a multiplexer comprising switches, a buffer section for isolating the switches from a Least Significant Bit (LSB) DAC, and an LSB DAC. The DAC can function without any output amplifier, though an output amplifier may preferably be included as an output stage of the DAC.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

In general terms, the invention addresses a signal processing circuit that combines switches with a signal processing element. Portions of the signal to be processed are transmitted through individual switches. Because the switches are in the transmission line of the signal to be processed, the individual resistances of the switches can cause errors if there is a load on the signal. In many applications, the errors caused by the switches can reduce the accuracy of the output signal.

To solve the problem of the load provided by the switches, (the voltage drop across the switches which interferes with the transmission of the signal), the invention places buffers between each switch and the signal processing element. The buffers isolate the switch resistances from loading effects of the signal processing element. This substantially reduces the errors caused by the switches, and significantly improves accuracy of the output signal as a function of the input signal.

The principles of the invention may preferably be applied to signal processing in certain digital-to-analog converters. One type of digital-to-analog converter well known in the art is the R-2R ladder network. As mentioned above, the R-2R ladder network uses a precise resistive balance to transform a digital signal into analog voltage. In the R-2R ladder, each successive bit in the digital signal, from the most significant bit (MSB) to the least significant bit (LSB), is converted into an analog voltage output having substantially half the value of the previous bit. In this fashion, digital signals can be converted into analog voltages within one LSB. The number of discrete analog output levels the DAC is capable of generating is $2^n$, where n is the number of bits in the digital signal.

As mentioned above, operation of the individual analog switches used in an R-2R network may upset the precise balance of the ladder network because each switch has a resistance which adds to the resistance in the 2R branch of the circuit.

Generally, in a DAC according to the principles of the invention, an R-2R ladder network DAC includes analog switches for implementing the digital signal. The invention overcomes the problem of the switch resistance upsetting the resistor ratio in the ladder network by adding a buffer between the individual switches and the 2R portion of each segment of the digital-to-analog converter, e.g., one segment comprising the switch portion, the buffer, and the 2R portion of the ladder, within the ladder network. Each resistor in the 2R portion of the ladder is driven by voltage at the output of a buffer. Therefore, the switch resistance is not in any way part of the R-2R ladder. This is unlike conventional R-2R ladders. For conventional R-2R ladders to provide accurate digital-to-analog conversion, the switch sizes have to be scaled to provide suitable resistance according to the bit in which the switch is located.

Figure 1:
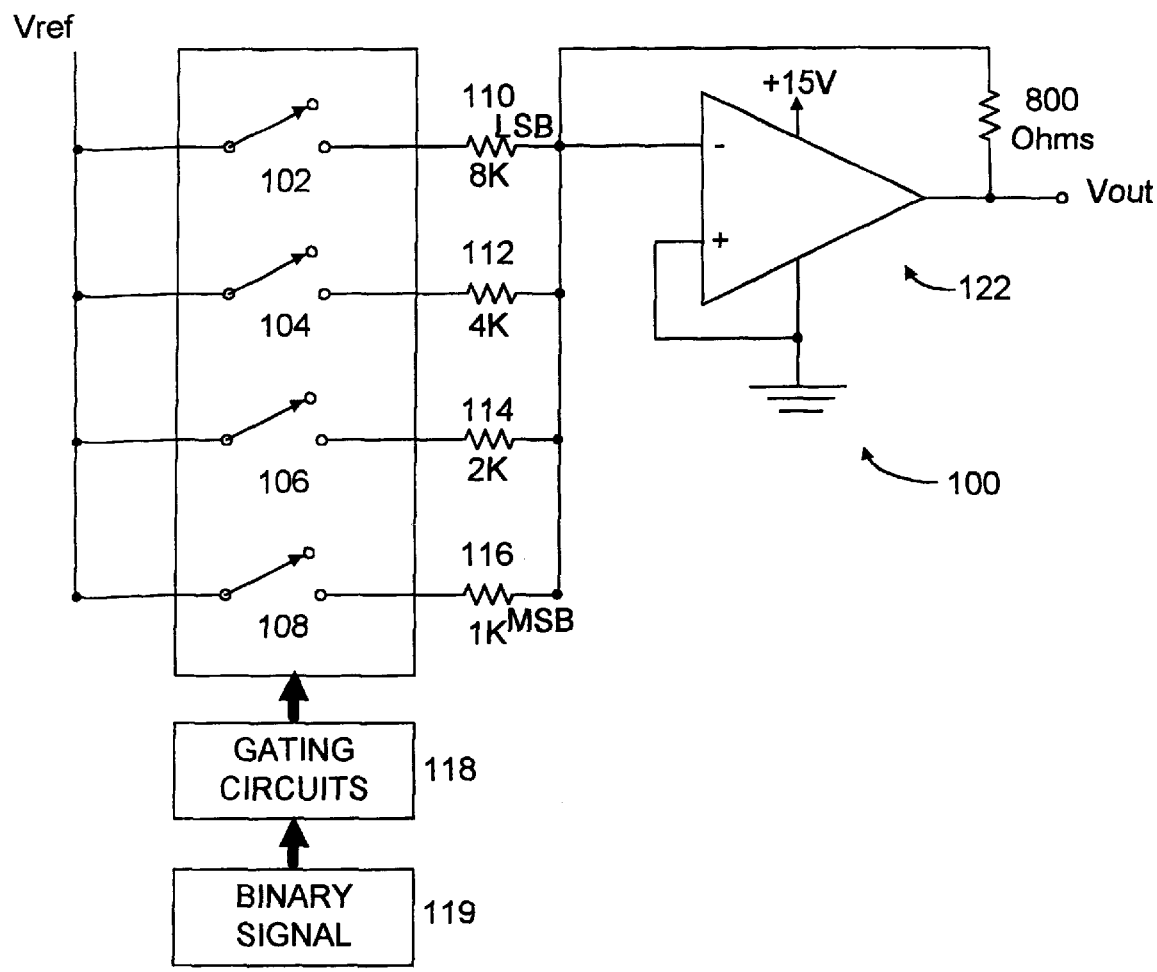
FIG. 1 is a circuit diagram of a conventional binary weighted resistor-string DAC.
Figure 2:
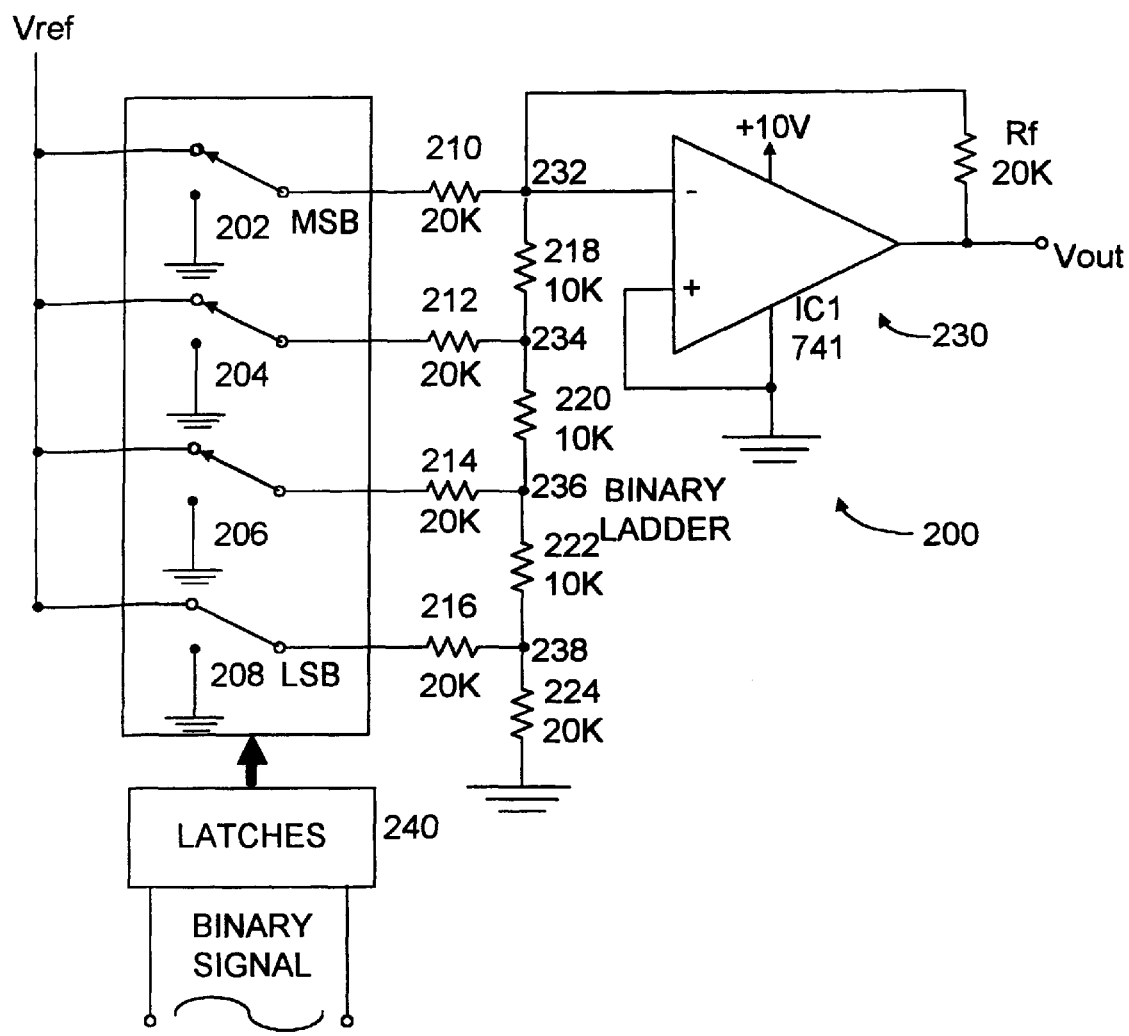
FIG. 2 is a circuit diagram of a conventional R-2R ladder-network DAC.
Figure 3:
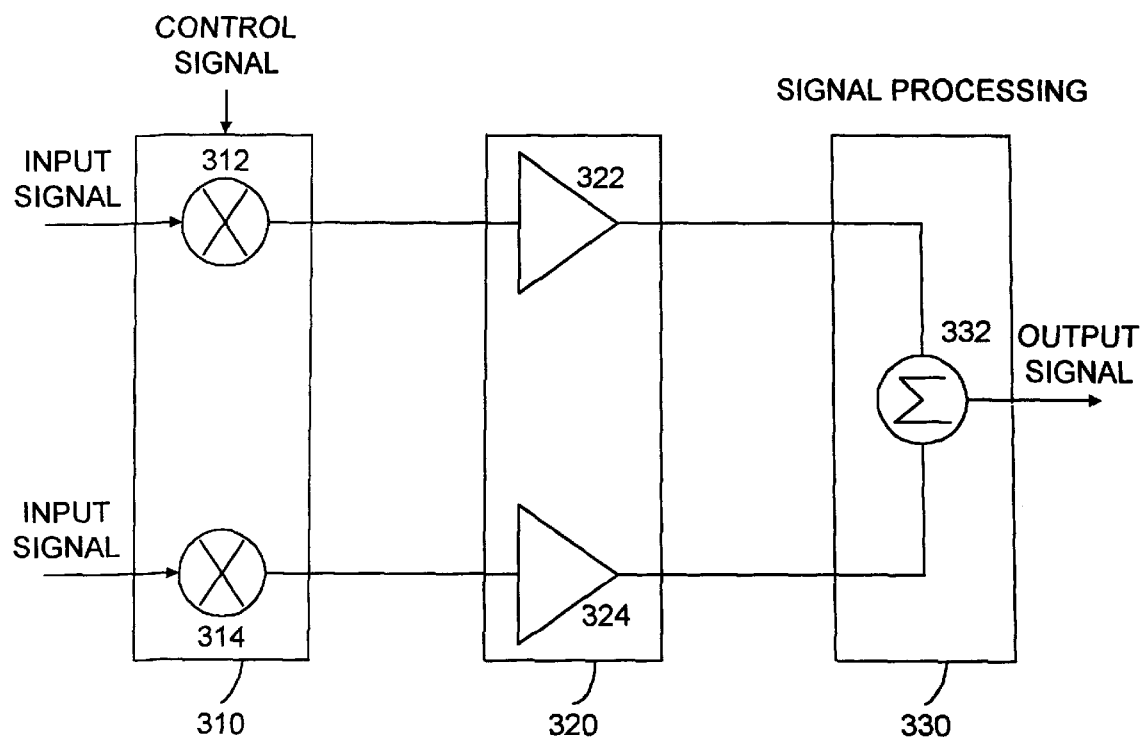
FIG. 3 is a circuit diagram of a signal processor according to the principles of the invention.

FIG. 3 shows a signal processor according to the principles of the invention. Switches 312 and 314 in switch element 310 are directly connected to buffers 322 and 324 in buffer element 320, which are connected, in turn, to signal processing element 332 in output element 330.

When switches 312 and/or 314 are turned ON in response to a control signal, an input signal passes through them to buffers 322 and/or 324. The buffers pass the signal to signal processing element 332. The buffers isolate the switch resistances from signal processing element 332 by allowing a voltage signal to pass through to the signal processing element 332, but not allowing a current to pass through to signal processing element 332. Therefore, the effect of the switch resistances on the input signal to output signal is eliminated or greatly reduced. The buffers may preferably be implemented using a unity-gain CMOS amplifier or some other suitable buffering device which is known in the art.

Figure 4:
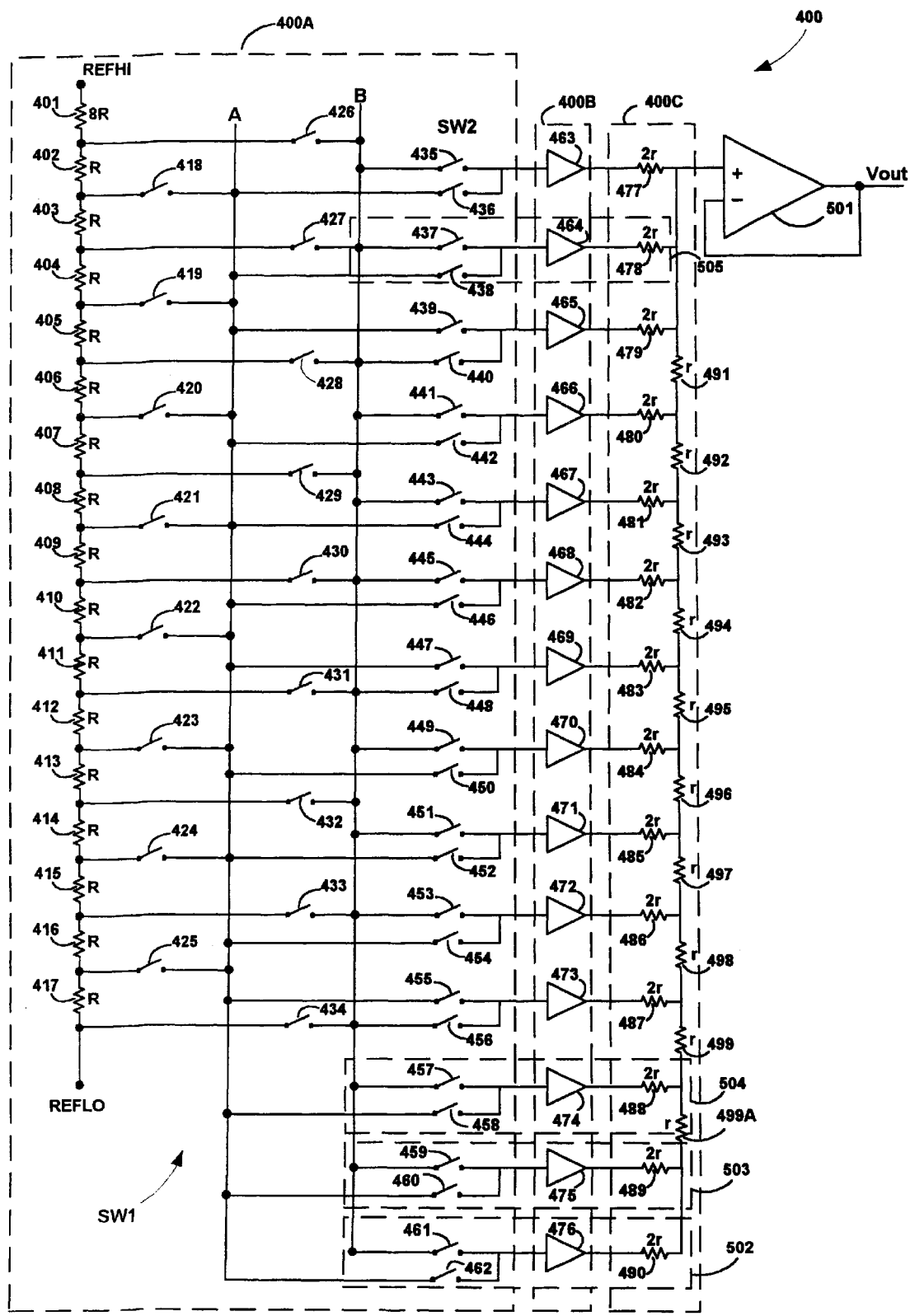
FIG. 4 is a circuit diagram of a DAC according to the principles of the invention.

FIG. 4 shows a preferred embodiment of a DAC 400 according to the principles of the invention. DAC 400 is a simplified schematic of a 16-bit precision voltage output DAC. The complete 16-bit data-converter is composed of two DAC sections: a 4-bit MSB resistor-string DAC 400A which receives the 4 most significant bits of the digital signal, and a 12-bit LSB R-2R ladder network DAC 400C which receives the 12 least significant bits of the digital signal. The 4-bit DAC 400A preferably includes resistors 401–417, and switches 418–434. The buffer section 400B preferably includes buffers 463–476. The 12-bit DAC 400C preferably includes switches 435–462, buffers 463–476 and resistors 477–499a.

The 4 MSB inputs (not shown), which comprise a portion of a control signal, are encoded to drive the bank of switches SW1 composed of seventeen switches (switches 418–434). These switches connect the two signal lines 'A' and 'B' across one of the resistor in the resistor string comprising resistors 401–417. The resistor connected across signal lines A and B is determined by the 4 most significant bits input into the 16-bit DAC 400. This may be accomplished by gating circuitry as is well known in the art. This sets the voltage of signal lines A and B, which, in turn, sets the high and low voltage limits for the 12-bit DAC 400C.

The resistor string comprising resistors 401–417 serves as a voltage divider between REFHI and REFLO, which are the voltage rails for DAC 400. These rails may preferably be attached to input pins, and their values may preferably be set by the user. In the particular embodiment shown in FIG. 4, the uppermost resistor 401 is 8 times the resistance of the other 16 resistors 402–418 in the string to reduce the REFHI voltage level across the resistors by one third. This is done to protect internal components of the DAC which are not necessarily suited to the full rail-to-rail voltage swing.

The 4-bit DAC 400A operates as follows. If the code 0000 is input in the 4 MSBs, this code turns on only the bottom two switches in bank SW1 (switches 434 and 425) and connects lines A and B across the bottom resistor 417, i.e., the resistor adjacent to REFLO. Conversely, code 1111 in the 4 MSBs turns on only the top two switches in bank SW1 (switches 426 and 418) and connects signal lines A and B across resistor 402. As the code changes, the higher potential preferably toggles between signal lines A and B for successive signals. Thus, the 4-bit DAC 400A sets the top and bottom voltage limits for the 12-bit DAC 400C. This is well known in the art as an interpolating DAC architecture.

The 12-bit DAC 400C comprises switch bank SW2 including 14 pairs of switches 435–462 connected across signal lines A and B, and 14 unity-gain buffers 463–476 which drive the appropriate resistor in the r-2r ladder. This ladder is configured in a voltage switching mode because the output is preferably coupled to a high-impedance node. (In FIG. 4 the output amplifier 501 is shown as providing the high impedance node, though other configurations are possible and do not depart from the scope of the invention. In fact, the output of the circuit could be taken directly from the output of 12-bit DAC 400C. In addition, gain resistors (not shown) may be connected across output amplifier 501 to increase the output swing of 16-bit DAC 400.) The 12 LSBs of the 16-bit input (not shown), which comprise another portion of the control signal, are encoded to drive switch bank SW2 which connects the input of buffers 463–476 to signal lines A or B. The top two bits in the R-2R ladder shown in FIG. 4 are preferably thermometer-encoded as opposed to binary-encoded. This portion preferably requires three segments, as opposed to two, because a two-bit thermometer code has three distinct transitions representing the four possible values of a two-bit input, i.e., 00, 10, 01, 11. These bits do not require resistors between successive segments because they provide sequentially weighted signals and not binarily weighted signals. Any number of the bits in the DAC can be thermometer-encoded without departing from the scope of the invention.

The remaining 10 LSBs of the 12-bit DAC are used to drive the appropriate switch in bank SW2 and couple the input of the appropriate buffer to signal line A or B. The lowermost section, segment 502, acts as a termination branch. It can be shown that this termination branch results in binary weighting for the remaining segments.

The 12-bit DAC 400C operates as follows. Once the 4-bit DAC 400A has established a difference in potential across signal lines A and B, the bank of SW2 switches may preferably implement the digital signal transmitted to them. For example, if the digital signal 0000 0000 0001 is transmitted to the 12-bit DAC, only segment 503, comprising switches 459 and 460, buffer 475 and resistor 489 is connected to the higher of the signals A and B. (Switches 461 and 462 are configured such that segment 502 is always coupled to the signal line which is lower in voltage.) Conversely, if the digital signal 1111 1111 1111 is input, all the segments (except 502, which is always tied to the lower of the two signals) are connected to the higher of the two signals A or B, thus generating the maximum voltage for a given input to the 4-bit DAC 400A.

The buffers 400B isolate the 12-bit DAC 400C from the switch resistances of the switches in SW1 and SW2 as follows. The buffers 400B greatly reduce or eliminate current flow through any of the switches in SW1 or SW2. This reduces or eliminates any voltage drop across these switches.

Importantly, the currents through the 2R resistors are driven by voltage appearing at the output of buffers 463–476. Therefore, the R-2R ladder is substantially isolated from effects of the resistance of switches 435–462. Thus, these switches can all be substantially the same size as one another, unlike in conventional R-2R DACs. This simplifies fabrication of the switches and reduces the die size required for their implementation.

The architecture of the individual DAC may utilize all thermometer-encoded segments, such as segment 505, all binary segments, such as converter 504, or any combination of the two.

Thus it is seen that a signal processor that is independent of the resistance of analog switches and which may be used in signal processing portions of DACs has been provided. One skilled in the art will appreciate that the present invention can be practiced by other than the described embodiments, which are presented for purposes of illustration rather than of limitation, and the present invention is limited only by the claims which follow.

What is claimed is:

1. A signal processor for processing an input signal to produce a final output signal, said signal processor comprising:

a plurality of switches coupled to receive a first control signal, wherein each of said switches produces one of a plurality of intermediate output signals in response to a portion of said first control signal and a portion of said input signal;

a processing circuit coupled to said switches, wherein said processing circuit produces said final output signal; and a plurality of buffers, each of said buffers located between one of said switches and said signal processing circuit, wherein each of said buffers receives one of said intermediate output signals and generates a buffered signal to said processing circuit and wherein said buffers isolate an impedance in each of said switches from said signal processing circuit such that said signal processing circuit functions substantially independently of said impedance.

2. The signal processor of claim 1 wherein said signal processor includes a signal pre-processing element that provides said input signal.

3. The signal processor of claim 2 wherein said signal pre-processing element comprises a digital-to-analog converter for receiving a second control signal and producing said input signal to said switches in response to said second control signal.

4. The signal processor of claim 2 wherein said signal pre-processing element comprises a resistor-string digital-to-analog converter.

5. The signal processor of claim 1 wherein said signal processor further comprises a multiplexer for arranging said plurality of switches in a pre-determined arrangement.

6. The signal processor of claim 1 wherein said processing circuit comprises a digital-to-analog converter.

7. The signal processor of claim 6 wherein said digital-to-analog converter is a twelve-bit R-2R ladder network converter.

8. The signal processor of claim 1 wherein said signal processor includes a signal pre-processing element that provides said input signal to said switches, said signal pre-processing element comprising a resistor-string digital-to-analog converter, and wherein said processing circuit comprises a twelve-bit R-2R ladder network digital-to-analog converter.

9. The signal processor of claim 1 wherein each of said buffers comprise a unity-gain amplifier.

10. A method for processing signals comprising the steps of:

inputting an input signal;
   providing a first control signal;
   producing a plurality of intermediate output signals by switching a plurality of switches to conduct a portion of said input signal, each switch being switched in response to a portion of said first control signal;
   buffering each of said intermediate output signals to create a plurality of buffered signals such that said buffered signals are substantially independent of an impedance in each of said plurality of switches; and processing said buffered signals in a signal processing network to obtain a final output signal.

11. The method of claim 10 wherein said inputting comprises converting a second control signal to said input signal.

12. The method of claim 10 wherein said inputting comprises converting a second control signal to said input signal with a resistor-string digital-to-analog converter.

13. The signal processor of claim 10 wherein said buffering comprises buffering with a unity-gain amplifier.

14. The signal processor of claim 10 wherein said processing comprises processing with a signal processing network including a digital-to-analog converter.

15. The signal processor of claim 10 wherein said processing comprises processing with a signal processing network including a R-2R ladder network digital-to-analog converter.

16. A signal processor comprising:

a means for inputting an input signal:

a means for providing a first control signal;

a means for producing a plurality of intermediate output signals by switching a plurality of switches to conduct a portion of said input signal, each switch being switched in response to a portion of said first control signal;

a means for buffering each of said intermediate output signals to create a plurality of buffered signals such that said buffered signals are substantially independent of an impedance in each of said plurality of switches; and a means for processing said buffered signals in a signal processing network to obtain a final output signal.

* * * * *

UNITED STATES PATENT AND TRADEMARK OFFICE
CERTIFICATE OF CORRECTION

PATENT NO. : 6,181,263 B1
DATED : January 30, 2001
INVENTOR(S) : Hassan Malik, William C. Rempfer James L. Brubaker Page 1 of 1

It is certified that error appears in the above-identified patent and that said Letters Patent is hereby corrected as shown below:

Column 1,
Line 21, change "resistor-string" to -- resistor --.
Line 42, change "resistor-string" to -- resistor --.

Column 3,
Line 9, change "resistor-string" to -- resistor --.

Column 4,
Line 42, change "one of the resistor" to -- one of the resistors --.

Column 6,
Line 21, change "said signal processing" to -- said processing --.
Line 26, delete both instances of "signal."

Signed and Sealed this

Sixteenth Day of October, 2001

Attest:

NICHOLAS P. GODICI
Attesting Officer
Acting Director of the United States Patent and Trademark Office